United States Patent [19]
Johnson

[11] Patent Number: 5,382,874
[45] Date of Patent: Jan. 17, 1995

[54] SELF-ALIGNING LIGHT DIRECTING SURFACE MOUNTABLE MINIATURE INCANDESCENT LAMP

[75] Inventor: Ralph E. Johnson, Los Alamitos, Calif.

[73] Assignee: Illumination Technology, Inc., Los Alamitos, Calif.

[21] Appl. No.: 970,767

[22] Filed: Nov. 3, 1992

[51] Int. Cl.$^6$ .............................................. H01K 1/42
[52] U.S. Cl. ...................................... 313/578; 313/580
[58] Field of Search ............................... 313/578, 580

[56] References Cited

U.S. PATENT DOCUMENTS

| | | | |
|---|---|---|---|
| 3,060,344 | 10/1962 | Scholes | 315/58 |
| 3,320,466 | 5/1967 | Ayres et al. | 313/580 X |
| 3,346,751 | 10/1967 | Lienhard | 313/32 |
| 4,537,323 | 8/1985 | Ditchek et al. | 220/2.1 R |
| 4,710,677 | 12/1987 | Halberstadt et al. | 313/580 |
| 4,713,580 | 12/1987 | Schoene | 313/624 |
| 4,952,838 | 8/1990 | DuNah | 313/318 |
| 4,959,761 | 9/1990 | Critelli et al. | 362/226 |
| 4,970,428 | 11/1990 | Hayakawa et al. | 313/318 |
| 5,138,226 | 8/1992 | Johnson | 313/623 |

FOREIGN PATENT DOCUMENTS 270866 6/1988 European Pat. Off. ...... H01J 61/35
0159228 1/1979 Netherlands .................... 313/580

Primary Examiner—Sandra L. O'Shea
Attorney, Agent, or Firm—Klein & Szekeres

[57] ABSTRACT

A surface mountable miniature incandescent lamp assembly has an elongated substantially cylindrical glass envelope wherein a filament is contained in contact with metal members having glass-to-metal seals with the glass envelope. A substantial portion of the outer surface of the glass envelope is coated with a light reflective metal coating, with a non-coated elongated window transparent to light being left on the surface. The metal members extend axially to the outside from the envelope and, when mounted to a circuit board provide electric contact for the lamp. At least one of the end members includes a unique surface feature, such as a flat portion of an otherwise cylindrical surface, which is directionally coupled relative to the window of the glass envelope and which acts as a key or indexing surface for mounting the lamp assembly to the receiving surface (circuit board) with the window disposed in the desired direction.

18 Claims, 3 Drawing Sheets

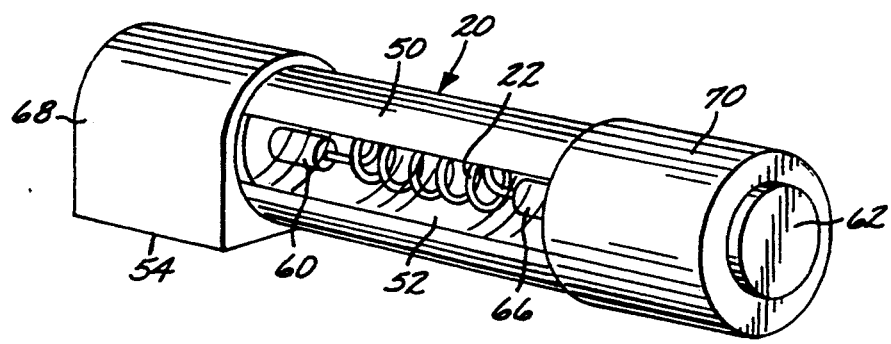
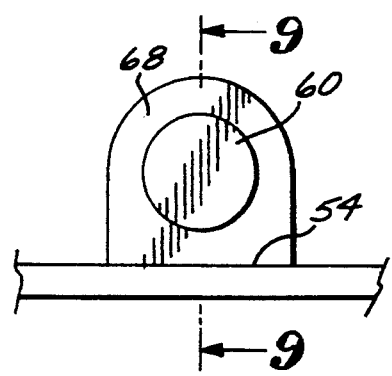
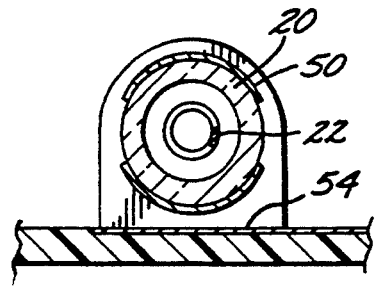
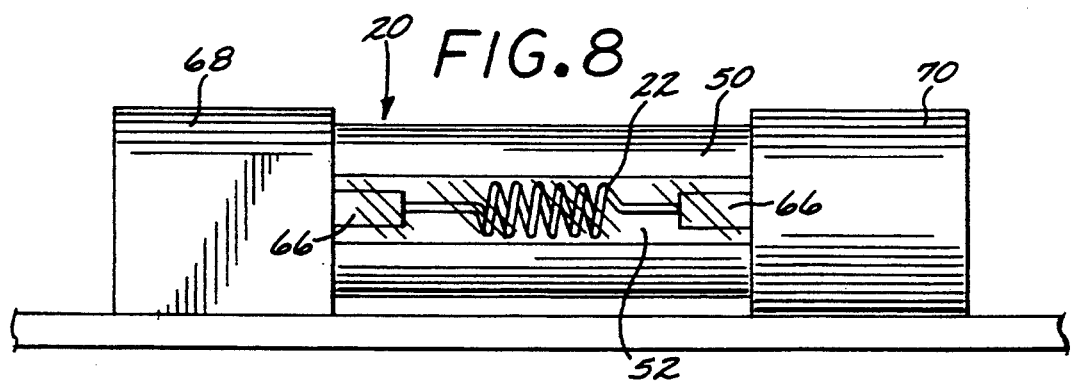
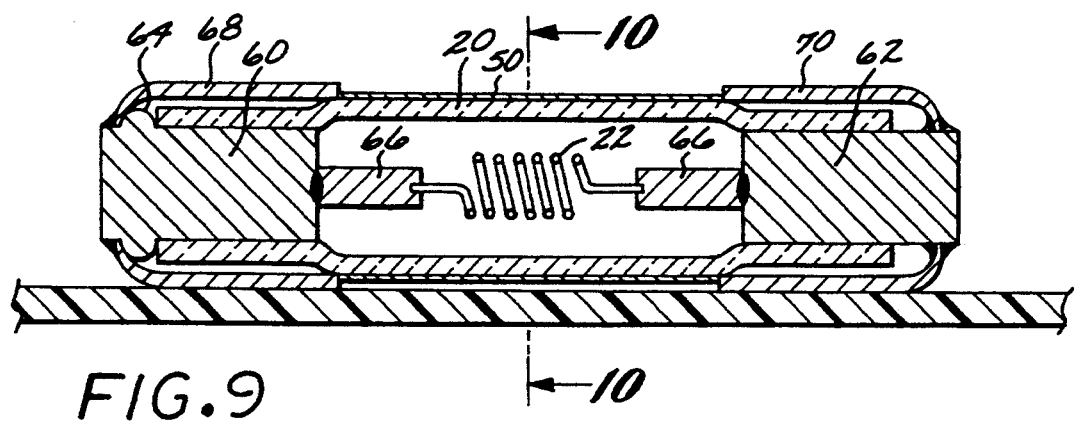

SELF-ALIGNING LIGHT DIRECTING SURFACE MOUNTABLE MINIATURE INCANDESCENT LAMP

BACKGROUND OF THE INVENTION

1. Field of the Invention

The present invention is directed to a surface mountable miniature incandescent lamp assembly, and more particularly to a surface mountable miniature incandescent lamp assembly which directs light predominantly in a one direction, and which is rotationally keyed for surface mounting so as to position the lamp for directing the light in the desired direction.

2. Brief Description of the Prior Art

Miniature incandescent lamps have many applications in electronic and like appliances and equipment, with digital watches serving as primary examples. It is generally recognized in the art that for economy of manufacture the miniature incandescent lamps must be adapted for surface mount technology, that is the miniature incandescent lamps must be capable of being incorporated in equipment (such as an electronic watch) in an electronic assembly line without the need of soldering or welding connections to a circuit board.

A miniature incandescent lamp assembly which is advantageously mounted to a circuit board without the need for soldering or welding connections to the circuit board, and which has other advantages, such as relative simplicity of manufacture and ease of assembly, is described in the present inventor's U.S. Pat. No. 5,138,226, assigned to the same assignee as the present application. U.S. Pat. Nos. 3,060,344, 3,346,751, 4,537,323, 4,713,580, 4,952,838, and 4,970,428 comprise more remote background to the present invention.

Because miniature incandescent lamps tend to be powered by relatively small power sources, such as the batteries of a digital watch, the power consumption of such lamps is an important factor in their design and use. In this regard it is well known that frequent use of the lamp of an ordinary digital watch significantly shortens the useful life of the battery, so much so that one minute of the activation of the incandescent lamp may reduce battery life for normal powering of the watch by several days. In light of this, it is desirable to reduce the power consumption of miniature incandescent lamps, and/or to utilize the light generated by the miniature lamp in a more efficient manner, so as to permit use of a lamp which draws less power from the battery. The present invention accomplishes these objectives while retaining the advantages of relative ease of manufacture and assembly of the miniature incandescent lamp described in U.S. Pat. No. 5,138,226.

SUMMARY OF THE INVENTION

It is an object of the present invention to provide a miniature incandescent lamp assembly which is adapted for mounting to a surface, such as circuit board, without soldering or welding connections.

It is another object of the present invention to provide a miniature incandescent lamp assembly which projects light predominantly only in a desired direction, and which is equipped with built-in means for rotationally aligning the lamp assembly relative to a receiving surface, such as a circuit board, so that the mounted lamp assembly is automatically disposed to direct its light in the desired direction.

The foregoing and other objects and advantages are attained by a miniature incandescent lamp assembly, which has an elongated substantially cylindrical glass envelope wherein a filament is contained in contact with metal members having glass-to-metal seals with the glass envelope. A substantial portion of the outer surface of the glass envelope is coated with a light reflective coating, with a non-coated elongated window being left on the surface where through light is directed to the outside when the filament is energized. The metal members extend axially to the outside from the envelope and provide electric contacts for the lamp. At least one of the end members includes a unique surface feature, such as a flat portion of an otherwise cylindrical surface, which is directionally coupled relative to the window of the glass envelope and which acts as a "key" or indexing surface for mounting of the lamp assembly to the receiving surface (circuit board) with the window disposed in the desired direction.

BRIEF DESCRIPTION OF THE DRAWINGS

FIG. 6 is a perspective view of a second preferred embodiment of the miniature lamp assembly of the present invention.

FIG. 7 is a left end view, schematically showing the lamp assembly mounted to a flat surface.

FIG. 8 is side view of the second preferred embodiment.

FIG. 9 is a cross-sectional view taken on lines 9,9 of FIG. 7.

FIG. 10 is a cross-sectional view taken on lines 10,10 of FIG. 9.

DESCRIPTION OF THE PREFERRED EMBODIMENTS

Figure 1:
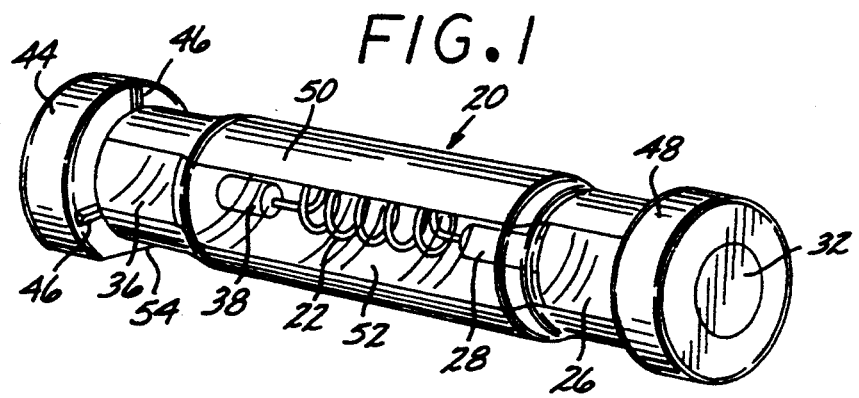
FIG. 1 is a perspective view of a fist preferred embodiment of the miniature lamp assembly of the present invention.

The following specification taken in conjunction with the drawings sets forth the preferred embodiments of the present invention. The embodiments of the invention disclosed herein are the best modes contemplated by the inventor for carrying out his invention, although it should be understood that various modifications can be accomplished within the parameters of the present invention.

It is noted at the outset that the principal novel features of the miniature lamp assembly of the present invention relate to the coupling of a light transmitting window with means, such a "key" or indexing surface, for mounting the miniature lamp assembly on a receiving surface, so that the light transmitting window is disposed in a desired position. These novel features are advantageously combined in the preferred embodiments with the features of the miniature lamp assembly described in U.S. Pat. No. 5,138,226, the specification of which is expressly incorporated herein by reference. Features and components of the preferred embodiments of the lamp assembly of the present invention which are substantially common with the features of the lamp assembly of this reference patent, are described here only briefly and to the extent necessary to describe and explain the present invention.

Thus, referring now to FIGS. 1 through 5, the first preferred embodiment of the light assembly of the present invention is disclosed. As is described in U.S. Pat. No. 5,138,226, the miniature incandescent lamp assembly includes a substantially cylindrical glass envelope 20. Except for the reflective coating on a portion of its outer surface, the glass envelope 20 is otherwise conventional and typically comprises GO120 (soda-lead) glass, which is commercially available in the United States. A typical diameter of the glass envelope 20 which is used in the present invention is approximately 0.062 inch, and a typical length is approximately 0.350 inch. The glass envelope 20 utilized in the preferred embodiments of the present invention is purchased already cut by the manufacturer to the desired length.

An incandescent filament 22 (which per se is well known in the art) is disposed substantially in the middle of the glass envelope 20, aligned substantially axially with the centerline of the envelope 20. A filament 22 which is typically used in the lamp assembly of the present invention comprises tungsten-rhenium alloy, and typically has a helical length of approximately 0.100 inch. The incandescent filament 22 used in the preferred embodiments of the present invention, is also available commercially.

The filament 22 is disposed in the glass envelope 20 by being held in electrical contact with metal end members which seal the glass envelope 20. More specifically, a first metal end member or end piece 24 (shown on the right side of FIGS. 1, 3 and 4) has a substantially cylindrical body 26 (slug) and a leg piece 28. The slug 26 provides, together with the glass envelope 20 a glass-to-metal seal of a relatively large area and of substantially cylindrical configuration. The slug 26 includes an axially outwardly extending portion 32 best shown on FIG. 4. The slug 26 of the first preferred embodiment of the present invention is approximately 0.120 inch long. The leg piece 28 is concentrically attached by a butt weld to the slug 26. The filament 22 is mechanically welded to the leg piece 28 of the slug 26.

Referring now to the other (left) end of the glass envelope 20, the envelope 20 is sealed by a second metal end member or end piece, which is also referred to as a "plug" 36. The plug 36 also has a leg piece 38 which is butt welded to it. The filament 22 is attached to the leg piece 38 of the plug 36 by a mechanical weld.

The plug 36 has a substantially cylindrical main body 40 dimensioned to fit in the glass envelope 20 and to form a glass-to-metal seal. In the herein described preferred embodiment the substantially cylindrical main body 40 (of the same diameter as the internal diameter of the glass envelope 20) is approximately 0.052 inch long. A cap member 44 of the plug 36 is integrally constructed with the substantially cylindrical main body 40. The cap member 44 is of larger dimension than the glass envelope 20. As is described in more detail below, because of its unique configuration or shape, the cap member 44 acts as a surface mountable electrical contact and also as a "guide", or means for rotationally aligning the miniature lamp assembly on the receiving surface to which it is mounted. Three radially disposed protrusions or ribs 46, spaced at approximately 120° from one another, are located on the surface of the cap member 44 which is adjacent to the cylindrical main body 40 of the plug 36. The purpose of the protrusions or ribs 46 is to permit evacuation of air from the interior of the glass envelope 20 after the components of the miniature light are assembled and before the glass-to-metal seal of the plug 36 with glass envelope is formed by heating in vacuo.

Both the slug 26 and the plug 36 can be made from several metal compositions or alloys which are normally used in the art for similar purposes. A suitable metal composition which is used in the preferred embodiments of the invention for these parts has a nickel-iron core covered by a copper sheath (not shown). Such a metal composition or alloy is available commercially under the DUMET® tradename. Another suitable alloy for these parts is Nickel 42 alloy, which is also available commercially. An important requirement with regard to the alloy which forms these parts is that the alloy must have substantially the same thermal expansion as the glass envelope 20. The leg pieces 28 and 38 of the preferred embodiments are made from nickel. Nickel is a poorer conductor of heat than copper, and this is advantageous in a miniature incandescent lamp because it is desirable to minimize loss of heat from the energized filament 22. For this reason, in accordance with the state of the art, the miniature lamp of the invention (as well as miniature incandescent lamps of the prior art) are evacuated during the manufacturing process to have vacuum, rather than an inert gas, in the glass envelope 20.

Figure 3:
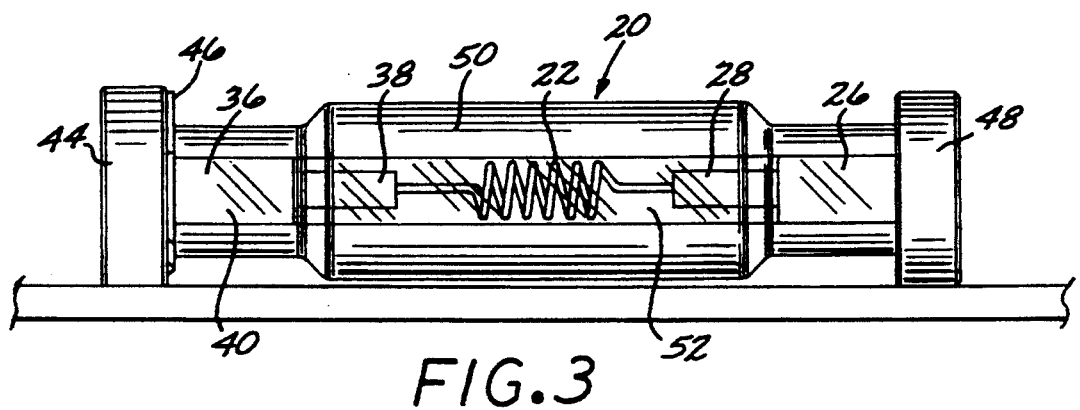
FIG. 3 is side view of the first preferred embodiment.
Figure 4:
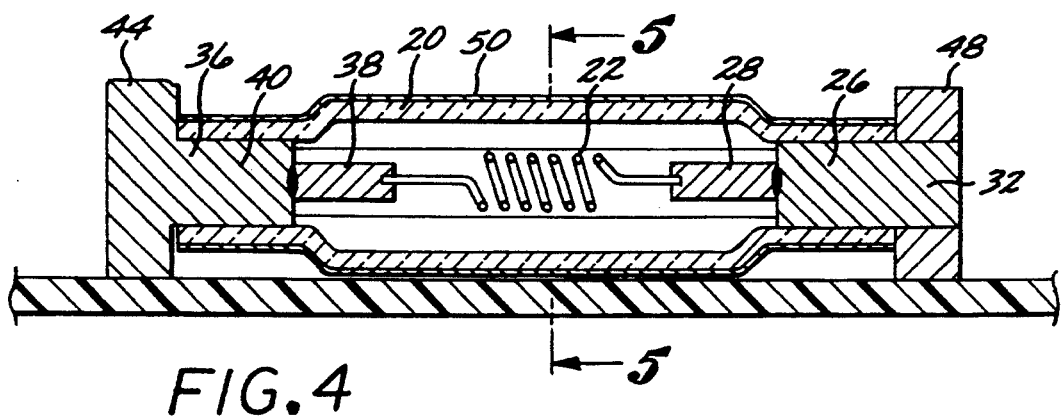
FIG. 4 is a cross sectional view taken on lines 4,4 of FIG. 2.

The right sides of FIGS. 1, 3 and 4 illustrate an annular cap member 48 mounted to the extending cylindrical portion 32 of the slug 26. The annular cap member 48 is friction fitted and soldered or welded to the slug 26. The cap member 48 is typically made from nickel, but can be made from a variety of conductive metal and alloys known in the art which can be soldered to the slug 26. The cap member 48 illustrated on the right side of FIGS. 1, 3 and 4 has a substantially cylindrical periphery. As in the reference U.S. Pat. No. 5,138,226, the cap member 48 acts as an electric contact for the lamp and is therefore in physical and electrical contact with the printed circuit board to which the lamp assembly is mounted.

As is mentioned above, a portion of the exterior surface of the glass envelope 20 has a light reflective coating 50. The light reflecting coating 50 covers the envelope's exterior surface in such a manner that a window 52 is formed where there is no coating. The window 52 is of a generally elongated configuration and is disposed substantially in alignment with the axis of the elongated envelope 20. The reflecting coating 50 may comprise aluminum, gold or silver metal, each of which can be deposited on the glass envelope by state-of-the-art "vacuum metallized deposition" techniques. Such "vacuum metallized deposition" is performed in a "vacuum metallization chamber" which is per se well known in the art. The window 52 is that portion of the glass envelope 20, where the metal coating 50 is deliberately not deposited during the vacuum metallized deposition process.

The purpose of the reflective metal coating 50 on the glass envelope 20 together with the window 52, is to direct light generated by the incandescent filament 22 into the direction of the window 52. Typically, as in the preferred embodiment, the window 52 extends to approximately 180° to 220° portion of the 360° circumference of the cylindrical glass envelope 20, so as to project back light for a desired surface, such as the liquid crystal display area (not shown) of a digital watch (not shown). It should be understood, however, that the dimensions of the window 52, and conversely of the reflective coating 50, are not critical from the standpoint of the present invention, and therefore both may occupy a varying range on the circumference of the cylindrical envelope. It will be readily seen however by those skilled in the art, that the combination of the reflective coating 50 and the window 52 tend to direct more of the total light output of the incandescent filament in the desired direction than a similar lamp assembly lacking these features. In fact, it is found in practice that light output in accordance with the present invention may be increased up to 500% in the desired direction relative to a prior art miniature lamp assembly. By-way-of example, the miniature lamp assemblies constructed in accordance with the present invention are designed to draw approximately 20 to 140 milliamper current.

Among the metals suitable for vacuum deposition on the exterior surface of the glass envelope 20 aluminum is preferred for reflecting visible light, although silver can also be used for this purpose. When reflection of infrared light rays is desired primarily, then the reflective coat 50 preferably comprises gold. The vacuum deposited aluminum reflective coat 50 of the herein described preferred embodiment is approximately 5-10 micro inches thick.

Figure 2:
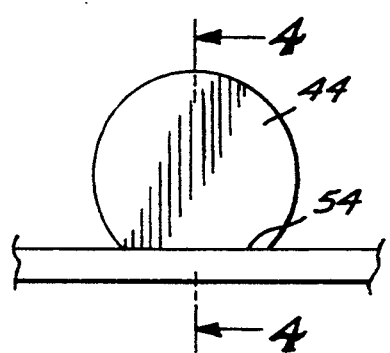
FIG. 2 is a left end view, schematically showing the lamp assembly mounted to a flat surface.
Figure 5:
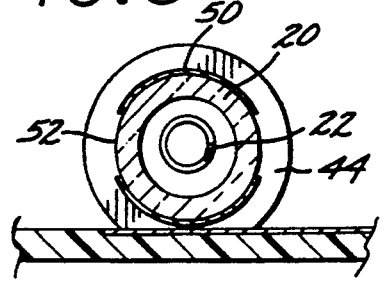
FIG. 5 is a cross sectional view taken on lines 5,5 of FIG. 4.

Referring now primarily to the left side of FIG. 1 and to FIGS. 2 and 5, the cap 44 of the plug 36 is illustrated to have a substantially flat surface 54 which has a fixed spatial relation relative to the location of the window 52 on the glass envelope 20. The flat surface 54 serves as a "key", or indexing surface for positioning the miniature lamp assembly of the invention, when the lamp assembly is "surface mounted" either by a human operator (not shown) or by automated machines (not shown). In other words, the flat "key" surface 54 of the cap member 44 serves as means for rotationally aligning or positioning the miniature lamp assembly on its receiving surface (printed circuit board) so that the window 52 is positioned in the desired direction. Because it is desirable in accordance with the present invention that the miniature lamp should be disposed parallel with the circuit board to which it is mounted, the diameter of the cap 44 is larger than that of the other cap 48 so as to compensate for the truncated surface 54.

It is also possible within the scope of the present invention to provide more than one "key" or "indexing surface" on the miniature light assembly, such as, for example, additionally providing a flat surface on the cap member 48 on the slug 26. This, however, is presently not preferred because, as it will be readily appreciated by those skilled in the art, if both cap members have an indexing surface then during the manufacturing process it is necessary to align the two surfaces with one another. Such an additional step is eliminated when, as in the herein described preferred embodiment, only one "rotational key" or indexing surface is utilized. In a preferred method of manufacturing the miniature lamp assembly of the present invention the reflective metal coating is deposited in a vacuum metallization chamber on the lamp which already has the cap members fully assembled, so that the "key" or flat index surface 54 of the cap member 44 acts as an alignment guide or positional index for the metal deposition process itself.

Referring now to FIGS. 6 through 10 of the appended drawings, a second preferred embodiment of the miniature incandescent light of the present invention is disclosed. Save for the novel features relating to the reflective coating, light directing window, and self-aligning "key" or indexing surface, the second preferred embodiment is constructed substantially similar to the second preferred embodiment described in the reference U.S. Pat. No. 5,138,226. Thus, two metal end pieces 60 and 62 are disposed in a substantially cylindrical glass envelope 20. Each of the metal end pieces 60 and 62 is of substantially cylindrical configuration and forms a glass-to-metal seal with the glass envelope 20. The end piece 60 has an upset or bulge 64 which prevents this end-piece 60 from completely entering the glass envelope 20 when the unit is assembled. Each of the metal end pieces 60 and 62 include a portion which extends axially outwardly from the glass envelope 20, and include a leg piece 66 to which the incandescent filament 22 of the miniature lamp is attached.

The glass envelope 20 of the second preferred embodiment, similarly to the glass envelope of the first preferred embodiment, has on its exterior surface a vacuum deposited light reflecting metal coat 50, (preferably aluminum) and a window 52 which is transparent to light. The rotational "key" or indexing surface is incorporated in this embodiment as a flat surface 54 of a hollow metal cap 68 which is soldered or welded to the protruding portion of the end piece 60. The other end piece 62 has a metal cap 70 of substantially cylindrical configuration which is also soldered or welded to it. The metal caps 68 and 70 are of larger dimension than the glass envelope 20 and act as surface mountable electrical contacts for the miniature light bulb. In addition, the flat "key" or indexing surface 54 rotationally aligns the window 52 in the desired position when the miniature lamp is surface mounted.

Figure 11:
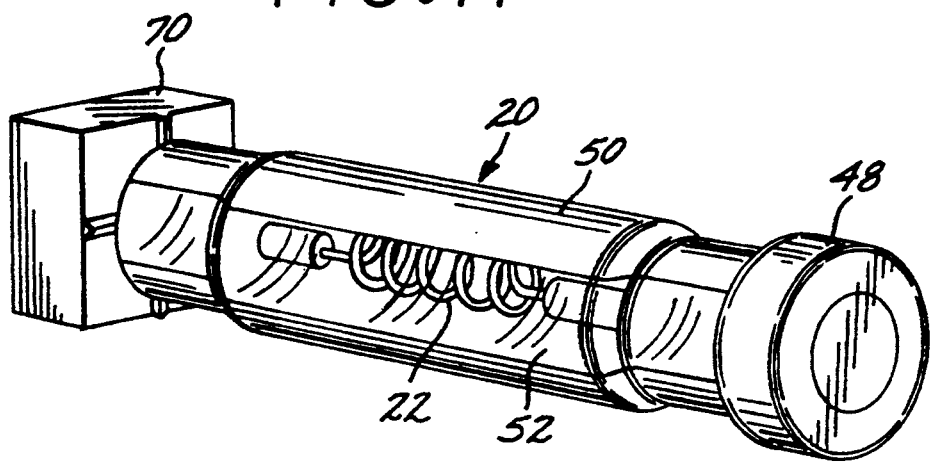
FIG. 11 is a perspective view of a third preferred embodiment.
Figure 12:
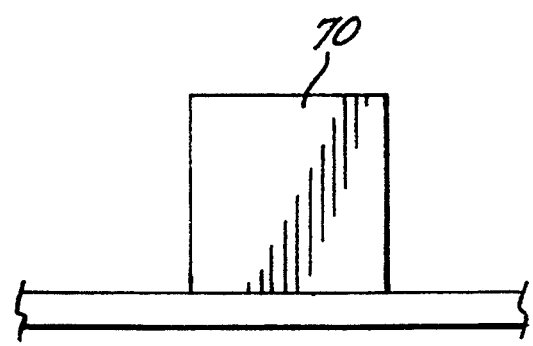
FIG. 12 is a left end view of the third preferred embodiment, schematically showing the lamp assembly mounted to a flat surface.

FIGS. 11 and 12 disclose a third preferred embodiment of the miniature lamp assembly of the present invention. This embodiment is similar in construction to the first preferred embodiment except that one of the end members (the plug 70) has a square exterior configuration. The flat surfaces of the square ended plug 70 act as the "key" or indexing surfaces to rotationally align the light-transparent window 52 of the envelope 20 when the third preferred embodiment is mounted on a receiving surface, such as a circuit board. The side of the square plug 70 is preferably the same dimension as the diameter of the other cap 48, so that the miniature lamp assembly is disposed parallel with the circuit board.

Principal advantages of the miniature incandescent light assembly of the present invention include the ability to direct light substantially only in a desired direction, and thereby to increase the efficiency of the miniature light bulb. Moreover, the miniature lamp is easily mounted on a surface, such as a circuit board with its light transmitting window in the proper position. Additionally, the preferred embodiments of the miniature lamp of the present invention also incorporate the advantageous features of the lamp assembly described in U.S. Pat. No. 5,138,226. In a modification of the miniature lamp of the present invention a glass rod (not shown) may be mounted to the lamp, next to the light transmitting window. In this combination the glass rod acts as a lens, and provides a narrow strip of light, which may be desirable in certain applications.

Several further modifications of the present invention may become readily apparent to those skilled in the art in light of the foregoing disclosure. Therefore, the scope of the present invention should be interpreted solely from the following claims, as such claims are read in light of the disclosure.

What is claimed is:

1. A surface mountable miniature incandescent lamp assembly, comprising:
   an elongated substantially cylindrical glass envelope having a first end and a second end, and having a light reflective coating disposed on a portion of its outer surface, the portion of the surface where there is no reflective coating forming a window transparent to light;
   a substantially cylindrical first metal end piece which seals the first end of the glass envelope in a first air-tight glass-to-metal seal of substantially cylindrical configuration, and second end piece which seals a second end of the glass envelope in a second air-tight glass-to-metal seal of substantially cylindrical configuration whereby there is no wire-to-glass seal in the lamp assembly;
   a filament disposed between the first and second metal end pieces within the interior of the glass envelope and in electrical contact with the first and second metal end pieces;
   alignment means included in at least one of the end pieces which is directionally coupled to the position of the light-transparent window on the glass envelope for rotationally aligning the lamp assembly relative to a reference surface with the window positioned in a predetermined direction, said alignment means configured to be disposed in contact with the reference surface when the lamp assembly is mounted to the reference surface.

2. The lamp assembly of claim 1 wherein the alignment means comprise a substantially flat surface included in one of the end pieces.

3. The lamp assembly of claim 2 wherein the substantially flat surface is disposed parallel with the longitudinal axis of the elongated substantially cylindrical glass envelope.

4. The lamp assembly of claim 1 wherein the reflective coating comprises a metal selected from a group consisting of aluminum, silver and gold.

5. The lamp assembly of claim 1 wherein the first end piece has a substantially cylindrical outer surface, said outer surface capable of being in contact with a circuit board and in electrical contact therewith when the lamp assembly is mounted to a circuit board, and wherein the second end piece includes the alignment means as flat surface capable of in mechanical and electrical contact with the circuit board.

6. The lamp assembly of claim 5 wherein the second end piece has an outer surface which has a substantially square cross section.

7. A surface mountable miniature incandescent lamp assembly, comprising:
   an elongated substantially cylindrical glass envelope having a first end and a second end, and having a light reflective coating disposed on a portion of its outer surface, the portion of the surface where there is no reflective coating forming a window transparent to light;
   a substantially cylindrical first metal end member which seals the first end of the glass envelope with a glass-to-metal seal of substantially cylindrical configuration;
   a substantially cylindrical second metal end member which seals the second end of the glass envelope with a glass-to-metal seal of substantially cylindrical configuration;
   a filament disposed between the first and second metal end members within the interior of the glass envelope and in electrical contact with the first and second metal end members whereby there is no wire-to-glass seal in the lamp assembly;
   a first metal cap larger in diameter than the glass envelope, affixed to the first metal end member and capable of serving as a surface mountable electric contact for the miniature incandescent lamp, and
   a second metal cap larger in diameter than the glass envelope, affixed to the second metal end member and capable of serving as a surface mountable electric contact for the miniature incandescent lamp, and
   alignment means included in at least one of the first and second metal caps which is directionally coupled to the position of the light-transparent window on the glass envelope for rotationally aligning the lamp assembly relative to a reference surface with the window positioned in a predetermined direction said alignment means configured to be disposed in contact with the reference surface when the lamp assembly is mounted to the reference surface.

8. The lamp assembly of claim 7 wherein the alignment means is a flat surface included in the second metal cap.

9. The lamp assembly of claim 8 wherein the second metal cap is integrally constructed with the second metal end member.

10. The lamp assembly of claim 7 wherein the substantially flat surface is disposed parallel with the longitudinal axis of the elongated substantially cylindrical glass envelope.

11. The lamp assembly of claim 7 wherein the reflective coating comprises a metal selected from a group consisting of aluminum, silver and gold.

12. The lamp assembly of claim 7 wherein the reflective coating is aluminum.

13. The lamp assembly of claim 7 wherein the reflective coating is deposited on an approximately 180° to 220° portion of the cylindrical outer surface of the glass envelope.

14. A unitized, self-aligning, light-directing miniature lamp system for mounting onto a substrate, the lamp system comprising:
   a substantially cylinder shaped lamp comprising a light transmitting cylinder including a glass envelope and two terminals for providing power thereto, said two terminals being sealed to the glass envelope in glass to metal seals of substantially cylindrical configuration and having a light emitting filament disposed between them, the lamp having no wire penetrating through the glass envelope; and
   an aligning member directionally coupled to the light transmitting cylinder for rotationally aligning the substantially cylinder-shaped lamp relative to the substrate, said aligning member configured to be disposed in contact with the substrate when the lamp assembly is mounted to the substrate.

15. The lamp system of claim 14, wherein the aligning member comprises an electrically conductive material, and wherein the aligning member is electrically coupled to one of the two terminals for providing power thereto.

16. The lamp system of claim 14, wherein the aligning member comprises an alignment surface.

17. The lamp system of claim 14, wherein the aligning member comprises an alignment surface lying in a plane substantially parallel to a lengthwise axis through the center of the substantially cylinder-shaped lamp.

18. The lamp system of claim 14, wherein the aligning member comprises a substantially cylindrical inner surface for coupling with the substantially cylinder shaped lamp.

* * * * *